U S009136256B2

United States Patent
Joshi

(10) Patent No.: US 9,136,256 B2
(45) Date of Patent: Sep. 15, 2015

(54) CONVERTER HAVING PARTIALLY THINNED LEADFRAME WITH STACKED CHIPS AND INTERPOSER, FREE OF WIRES AND CLIPS

(71) Applicant: Texas Instruments Incorporated, Dallas, TX (US)

(72) Inventor: Rajeev Dinkar Joshi, Cupertino, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/185,502

(22) Filed: Feb. 20, 2014

(65) Prior Publication Data
US 2015/0235999 A1    Aug. 20, 2015

(51) Int. Cl.
| | |
|---|---|
| H01L 21/44 | (2006.01) |
| H01L 25/16 | (2006.01) |
| H01L 25/00 | (2006.01) |
| H01L 23/495 | (2006.01) |
| H01L 23/498 | (2006.01) |
| H01L 21/56 | (2006.01) |
| H01L 23/31 | (2006.01) |
| H02M 7/00 | (2006.01) |

(52) U.S. Cl.
CPC .............. *H01L 25/165* (2013.01); *H01L 21/56* (2013.01); *H01L 23/3107* (2013.01); *H01L 23/49503* (2013.01); *H01L 23/49562* (2013.01); *H01L 23/49568* (2013.01); *H01L 23/49575* (2013.01); *H01L 23/49838* (2013.01); *H01L 25/50* (2013.01); *H02M 7/003* (2013.01)

(58) Field of Classification Search
CPC . H01L 25/165; H01L 25/50; H01L 23/49562; H01L 23/49575; H01L 23/49568; H01L 23/49838; H01L 23/49503; H01L 21/56; H01L 23/3107; H02M 7/003
See application file for complete search history.

(56) References Cited

U.S. PATENT DOCUMENTS

| | | |
|---|---|---|
| 7,335,972 B2 | 2/2008 | Chanchani |
| 2008/0036078 A1 | 2/2008 | Herbsommer et al. |
| 2011/0024888 A1 | 2/2011 | Pagaila et al. |
| 2013/0049077 A1 | 2/2013 | Herbsommer et al. |
| 2013/0082383 A1 | 4/2013 | Aoya |

*Primary Examiner* — Long Pham
(74) *Attorney, Agent, or Firm* — Steven A. Shaw; Frank D. Cimino

(57) ABSTRACT

Power supply system (100) comprises vertically sequentially a QFN leadframe (101), a first chip (110) with FET terminals on opposite sides, a flat interposer (120), and a second chip (130) with FET terminals and the terminals of the integrated driver-and-control circuit on a single side. Leadframe pad (107) has a portion (107*a*) recessed as pocket with a depth and an outline suitable for attaching the first chip with one terminal in the pocket and the opposite terminal co-planar with the un-recessed pad surface. The interposer comprises metal patterned in traces separated by gaps; the traces include metal of a first height and metal of a second height smaller than the first height, and insulating material filling the gaps and the height differences; one interposer side attached to the leadframe pad with the first chip, the opposite interposer side attached to the terminals of the second chip.

4 Claims, 8 Drawing Sheets

CONVERTER HAVING PARTIALLY THINNED LEADFRAME WITH STACKED CHIPS AND INTERPOSER, FREE OF WIRES AND CLIPS

FIELD OF THE INVENTION

The present invention is related in general to the field of semiconductor devices and processes, and more specifically to the structure and fabrication method of DC/DC converters, which have a partially thinned leadframe with stacked chips and an interposer, and are free of wires and clips.

DESCRIPTION OF RELATED ART

Among the popular families of power supply circuits are the power switching devices for converting on DC voltage to another DC voltage. Particularly suitable for the emerging power delivery requirements are the Power Blocks with two power MOS field effect transistors (FETs) connected in series and coupled together by a common switch node; such assembly is also called a half bridge. When a regulating driver and controller is added, the assembly is referred to as Power Stage or, more commonly, as Synchronous Buck Converter. In the synchronous Buck converter, the control FET chip, also called the high-side switch, is connected between the supply voltage $V_{IN}$ and the LC output filter, and the synchronous (sync) FET chip, also called the low side switch, is connected between the LC output filter and ground potential. The gates of the control FET chip and the sync FET chip are connected to a semiconductor chip including the circuitry for the driver of the converter and the controller; the chip is also connected to ground potential.

For many of today's power switching devices, the chips of the power MOSFETs and the chip of the driver and controller IC are assembled horizontally side-by-side as individual components. Each chip is typically attached to a rectangular or square-shaped pad of a metallic leadframe; the pad is surrounded by leads as input/output terminals. In other power switching devices, the power MOSFET chips and the driver-and-controller IC are assembled horizontally side-by-side on a single leadframe pad, which in turn is surrounded on all four sides by leads serving as device output terminals. The leads are commonly shaped without cantilever extensions, and arranged in the manner of Quad Flat No-Lead (QFN) or Small Outline No-Lead (SON) devices. The electrical connections from the chips to the leads may be provided by bonding wires, which introduce, due to their lengths and resistances, significant parasitic inductance into the power circuit.

In some recently introduced advanced assemblies, clips substitute for many connecting wires. These clips are wide and made of thick metal and thus introduce minimum parasitic inductance. Each assembly is typically packaged in a plastic encapsulation, and the packaged components are employed as discrete building blocks for board assembly of power supply systems.

In other recently introduced schemes, the control FET chip and the sync FET chip are assembled vertically on top of each other as a stack over the leadframe pad, with the physically larger-area chip of the two attached to the leadframe pad, and with clips providing the connections to the switch node and the stack top. Independent of the physical size, the sync FET chip needs a larger active area than the active area of the control FET chip, due to considerations of duty cycle and conduction loss. When both the sync chip and the control chip are assembled source-down, the larger (both physically and active area) sync chip is assembled onto the leadframe pad and the smaller (both physically and active area) control chip has its source tied to the drain of the sync chip, forming the switch node, and its drain to the input supply $V_{IN}$. A first clip is connected to the switch node between the two chips; an alongated second clip of the stack top is tied to input supply $V_{IN}$. The pad is at ground potential and serves as a spreader of operationally generated heat. The driver-and-control IC chip is assembled horizontally side-by-side near the stack of chips and clips and connected by bonding wires with the FET gates and the leadframe leads. Due to their forms and materials, the clips and wire bonds have resistances and inductances, which contribute to the parasitics of the system.

In yet another recently introduced power system, the driver-and-control chip is included in the vertical stack on top of the second clip. This assembly structure saves real estate of the leadframe pad and thus the printed circuit board, but accepts the risk of very long downhill bonding wires and thus the risk of wire sweep and subsequent electrical shorts during the encapsulation process.

SUMMARY OF THE INVENTION

For DC/DC power converters, the relentless market trend towards miniaturization calls for reduction of the board area consumed by the assembled system, as well as for reduced height. Needless to say that these goals should preferably be achieved while simultaneously the system performance is improved and the cost is reduced.

Applicant realized that the height of a system of chips and clips vertically assembled on a leadframe pad can be reduced when the low-side FET chip is embedded in the leadframe pad, which has a thinned out pocket to allow the insertion of a chip. After insertion, one terminal of the chip is electrically attached to the pad and the exposed other terminals of the chip become co-planar with the surface of the un-thinned pad portions and the leads.

Investigating ways of eliminating elements without sacrificing their functions, applicant discovered a method of drastically reducing the system height by replacing both clips with a single interposer and eliminating the discrete driver-and controller chip by integrating its circuitry into the chip of the high-side FET. The flat interposer is pre-fabricated by stamping and coining a metallic leadframe from a sheet of metal into a network of partially thinned low-resistance traces able to carry high currents and to spread heat, and then by filling the gaps and partially thinned metal portions with an insulating and re-enforcing molding compound. The interposer, stacked on the leadframe pad, has one trace attached to the terminals of the low-side chip inserted in the pad pocket, and other traces attached to the leads. Other interposer traces are attached to the high-side chip stacked on top of the interposer with the terminals of the high-side FET and the integrated driver-and-control circuitry. The stack of leadframe, interposer and chips may be encapsulated in a packaging compound; however, it is a technical advantage when the un-attached surface of the high-side chip is left un-encapsulated so that it is available for attaching a heat sink. This sink, together with the leadframe pad connected to a board sink, allows the double cooling of the system.

An embodiment of the invention is a power supply system such as a DC/DC converter, which has a vertically assembled stack including sequentially a QFN leadframe, a first (low-side) chip with FET terminals on opposite sides, a flat interposer, and a second (high-side) chip with FET terminals on one side. Furthermore, the second chip is integrated with the driver-and-controller circuitry. The leadframe has leads and a pad with a first surface facing away from the stack, and a second surface facing the stack. The first surface is for attachment to a PC board. The second pad surface has a portion recessed as a pocket with a depth and an outline suitable for attaching a semiconductor chip in the pocket. The pad is tied to the grounded output terminal of the system. The first chip has its FET source terminal attached to the recessed pocket and its FET drain and gate terminals co-planar with the un-recessed second pad surface.

The interposer has a planar third surface facing the first chip, an opposite planar fourth surface facing the second chip, and a uniform first height between the surfaces. The interposer metal is patterned in traces separated by gaps; the traces include metal of the first height and metal of a second height smaller than the first height. An insulating material fills the gaps and the differences between the first and the second heights. One trace, tied to the switch node terminal of the system, is with the third surface attached to the drain terminal of the low-side FET, and with the fourth surface attached to the source terminal of the high-side FET. Another trace, tied to the input terminal of the system, has the fourth surface attached to the drain terminal of the sigh-side FET.

DETAILED DESCRIPTION OF THE PREFERRED EMBODIMENTS

Figure 1:
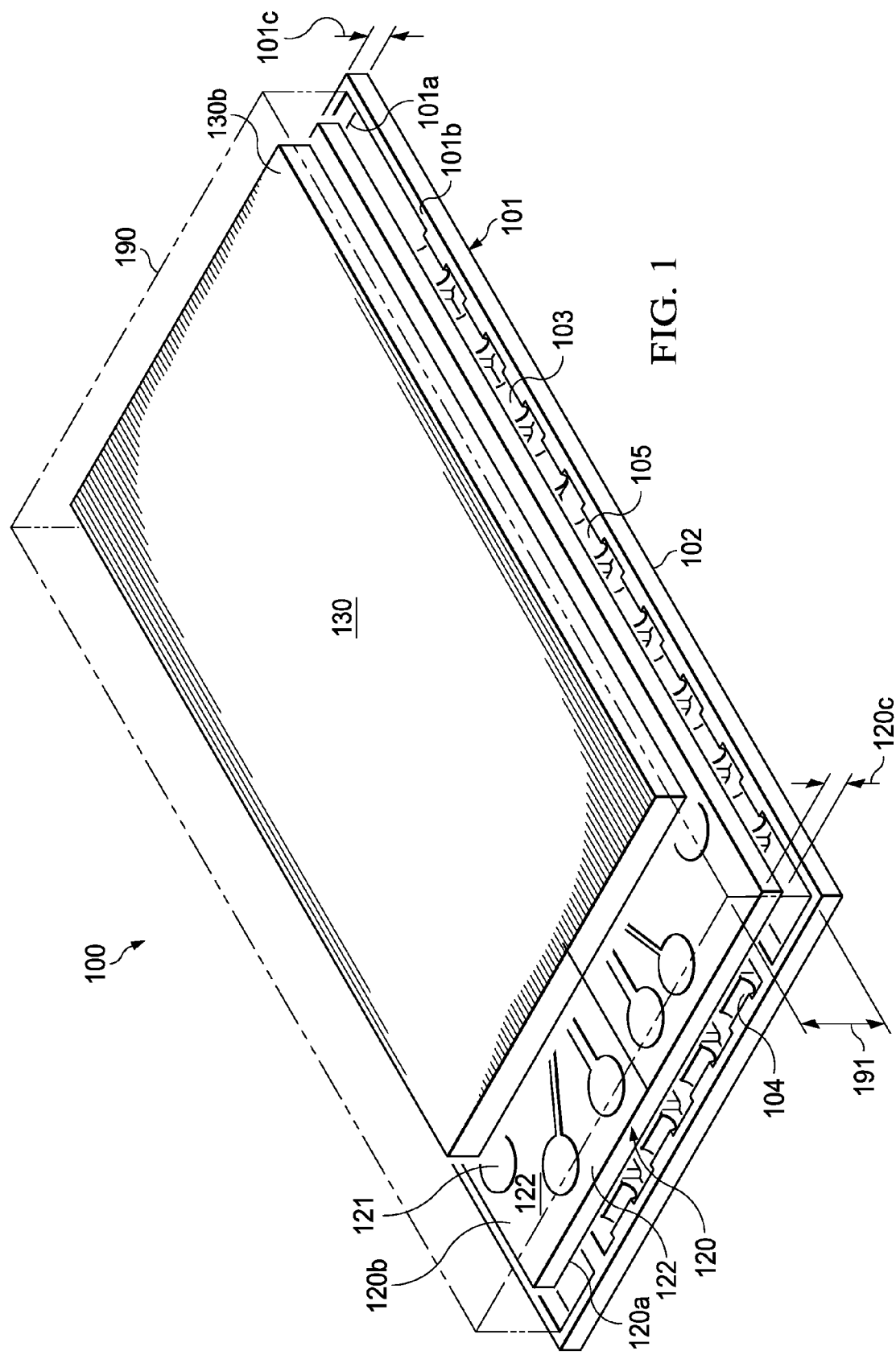
FIG. 1 shows a perspective view of an exemplary embodiment of the invention, a power supply system with vertically stacked chips and interposer, the system free of bonding wires and clips.

FIG. 1 illustrates a power supply system such as a DC/DC converter generally designated 100 as an exemplary embodiment of the invention; the system is shown before the step of trimming the rails 102 of the leadframe 101. For explanatory reasons, system 100 is shown with a transparent encapsulation 190. Preferred actual encapsulation uses a black-colored epoxy formulation suitable for a transfer molding technology. The exemplary system of FIG. 1 has a thickness 191 of <1 mm, i.e. between about 0.6 and 0.8 mm, and a rectangular footprint with a system length 192 of about 5 mm and a width 193 of about 6 mm. Other systems may be square-shaped; some are as small as 3 mm by 3 mm.

Visible through the transparent encapsulation is a vertically assembled stack, which includes sequentially a leadframe 101, a first chip with FET terminals of opposite sides (not visible in FIG. 1), a flat interposer 120, and a second chip 130 with FET terminals on one side (this side not visible in FIG. 1). FIG. 1 shows the bare silicon surface of second chip 130. Metal leadframe 101 is generally suitable for Quad Flat No-Lead (QFN) and Small Outline No-Lead (SON) type modules. The leadframe includes a pad (not visible in FIG. 1) and a plurality of leads 103, 104, 105, and 106. The leadframe is preferably made of copper or a copper alloy; alternative metal selections include aluminum, iron-nickel alloys, and Kovar™. Both surfaces of the leadframe may be prepared to facilitate solder attachment, for instance by a sequence of plated layers of nickel, palladium, and gold. In addition, at least one surface may have a metal layer deposited to enhance thermal conductivity, for instance by a plated layer of silver. Preferred thickness 101c of the leadframe metal for the exemplary embodiment shown in FIG. 1 is in the range from 0.2 mm to 0.3 mm; other embodiments may use thicker or thinner leadframe metal. From the standpoint of low cost and batch processing, it is preferred to start with sheet metal and fabricate the leadframe as a strip by stamping or etching, and to singulate the leadframe for the module by trimming the strip after the encapsulation process. Electrically, the pad is tied to grounded output terminal of the power supply system.

Figure 2:
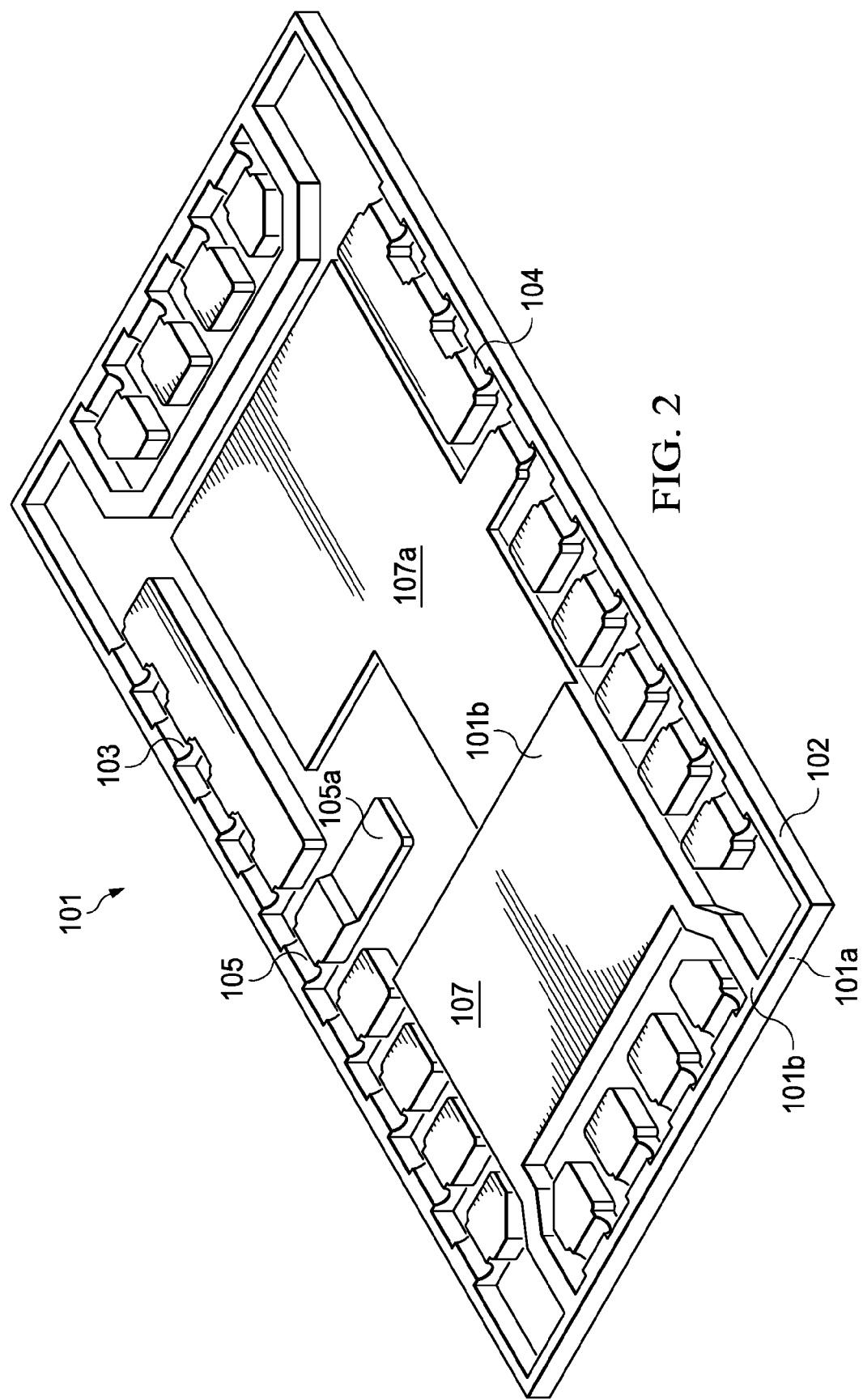
FIG. 2 illustrates a top view of a leadframe with a pad, which has a partially thinned or recessed portion suitable for assembling a semiconductor FET chip.

Leadframe 101 has a first surface 101a, which faces in a direction away from the stack and is depicted in more detail in FIG. 10, and a second surface 101b, which faces in the direction to the stack, which is described in more detail in FIG. 2. Interposer 120 has planar surface 120a facing the leadframe; surface 120a is referred to herein as third surface. The opposite planar surface 120b faces away from the leadframe and is referred to herein as fourth surface; it is visible in FIG. 1. Between the planar surfaces 120a and 120b, interposer 120 has a uniform height 120c, referred to herein as first height. In the exemplary embodiment shown in FIG. 1, height 120c may be between about 0.2 mm and 0.3 mm; in other embodiments, the interposer may be thinner or thicker.

Figure 4:
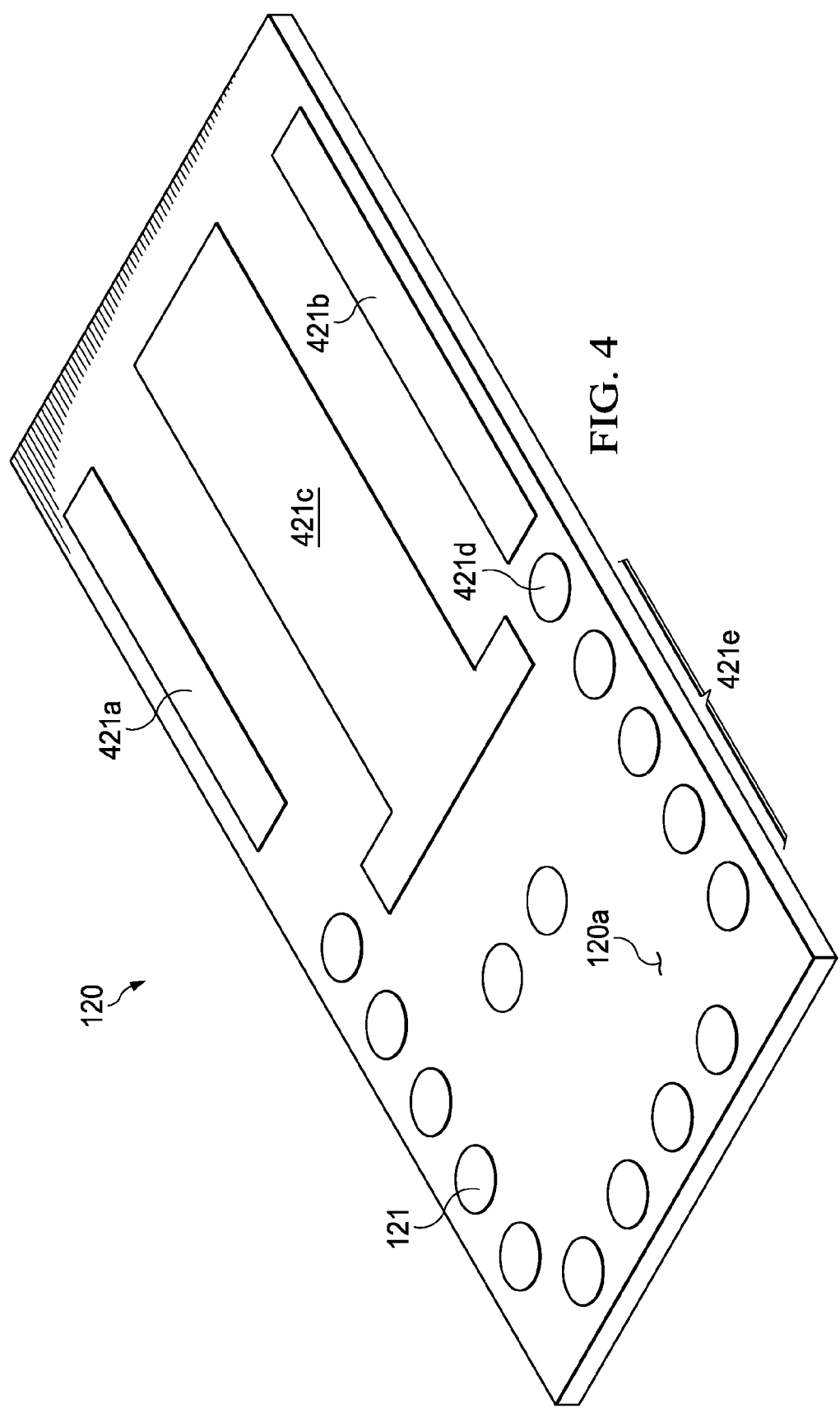
FIG. 4 shows the top view of an interposer formed in a sheet of metal for interconnecting the semiconductor chips of the system.
Figure 5:
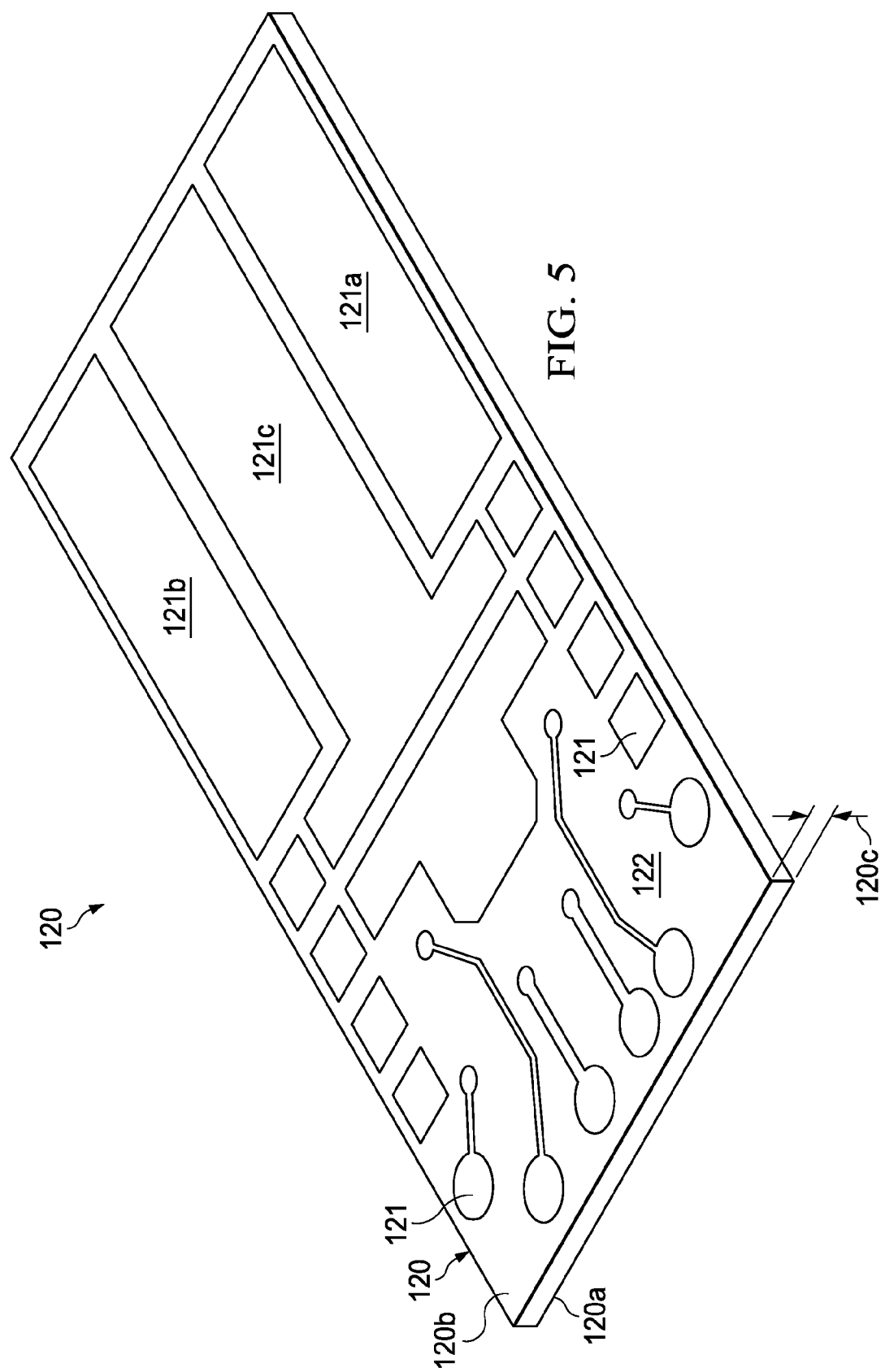
FIG. 5 illustrates the bottom view of the interposer of FIG. 4.
Figure 6:
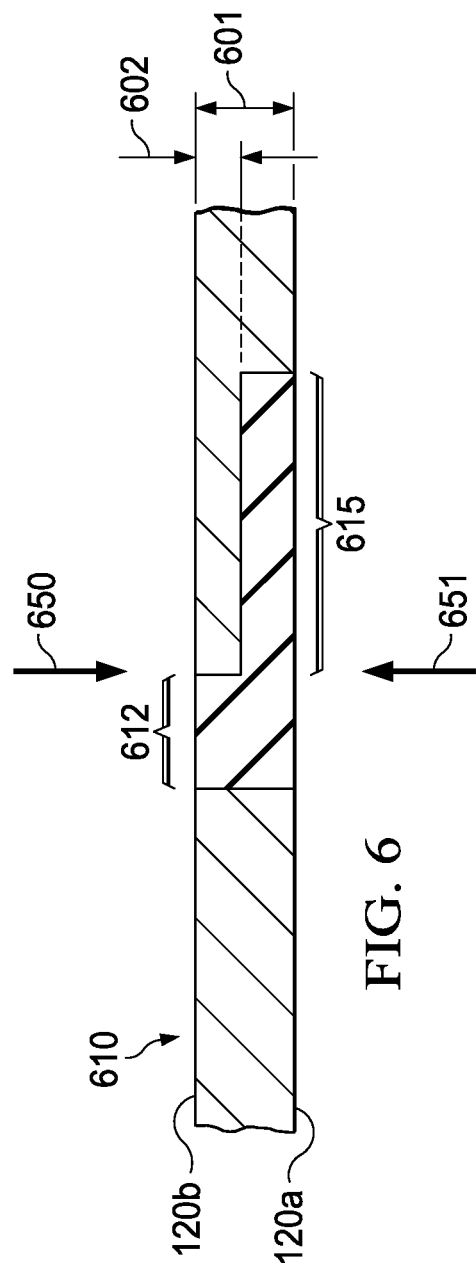
FIG. 6 is a cross section of a portion of the interposer of FIGS. 4 and 5, after a flat sheet metal has been processed through the steps of patterning, partial thinning, and filling the gaps between the metal traces with insulating material.

As described in more detail in FIGS. 4, 5, and 6, interposer 120 is made of a flat sheet of metal, which is patterned in a plurality of traces separated by gaps. Some traces of the plurality are visible in FIG. 1; they are generally designated 121. One of the traces of the plurality, designated 121a and herein referred to as first trace, is tied to the input terminal of the system. Some traces may be structured by partial etching or coining so that they include metal of the first height and metal of a second height smaller than the first height. An insulating material, such as a polymeric compound provided by a molding process, is used to fill the gaps 122 and the differences between the first and the second heights. Interposer 120 thus may provide different attachment pads on surface 120a and 120b, and it further provides interconnecting traces between the attachment pads. When a base metal is selected, which offers high electrical and thermal conductivity, the interconnections not only exhibit low electrical resistance, but also good heat spreading characteristics.

FIG. 1 further shows the side 130b of an FET chip 130, which is referred to herein as second FET chip, or high side of the system. Side 130b of chip 130 is free of FET terminals, since the terminals are on the chip side opposite to side 130b (thus not visible in FIG. 1). Chip 130 is flip-attached with all its terminals to the fourth surface 120b of the interposer. Visible in FIG. 1 is interposer trace area 122, onto which the source terminal of the second FET is attached and which serves electrically as the switch node of the system. When system 100 is encapsulated in packaging compound 190, surface 130b of chip 130 may stay un-encapsulated so that it is available to have a heat sink attached, improving the thermal characteristics of the system.

Chip 130 includes not only the second FET, but is also integrated with the driver-and-control circuitry. Consequently, the chip surface opposite side 130b not only includes the terminals of the second FET, but also the terminals of the driver-and-controller circuitry. As stated in conjunction with FIG. 5, the terminals of the second FET and the terminals of the driver-and-controller circuitry face the interposer and are attached to the matching interposer metal contacts.

FIG. 2 illustrates an exemplary leadframe 101, framed and held together by rails 102. The perspective view of FIG. 2 actually displays the second leadframe surface 101b, referred to as the second surface, onto which the sequence of semiconductor chips is to be stacked (the first surface 101a is not shown in FIG. 2). In the exemplary embodiment, pad 107 has approximately rectangular shape; for other systems, the pad may have square shape or any configuration suitable for attaching a semiconductor chip. A portion 107a of the second pad surface 101b is recessed relative to the plane of the original surface 101b of pad 107. Portion 107a, marked by dashed lines in FIG. 2, is shaped as a pocket and has a depth and an outline suitable for attaching a semiconductor chip (110 in FIG. 3) with its bottom terminals in the pocket. The attachment is performed so that the top terminals of the chip are co-planar with the plane of the original surface 101b. The recess can be achieved by one of several techniques including chemical or ion bombardment etching, and mechanical coining. In the exemplary leadframe of FIG. 2, the recess includes a portion 105a of lead 105, which serves as the contact for the gate terminal of FET chip 110 in the assembly of the FET chip.

It is a technical advantage if at least some leadframe portions have a surface with a metallurgical composition, which facilitates solder attachment, for example a thin layer of gold, or a sequence of layers such as nickel, palladium, and gold.

Figure 3:
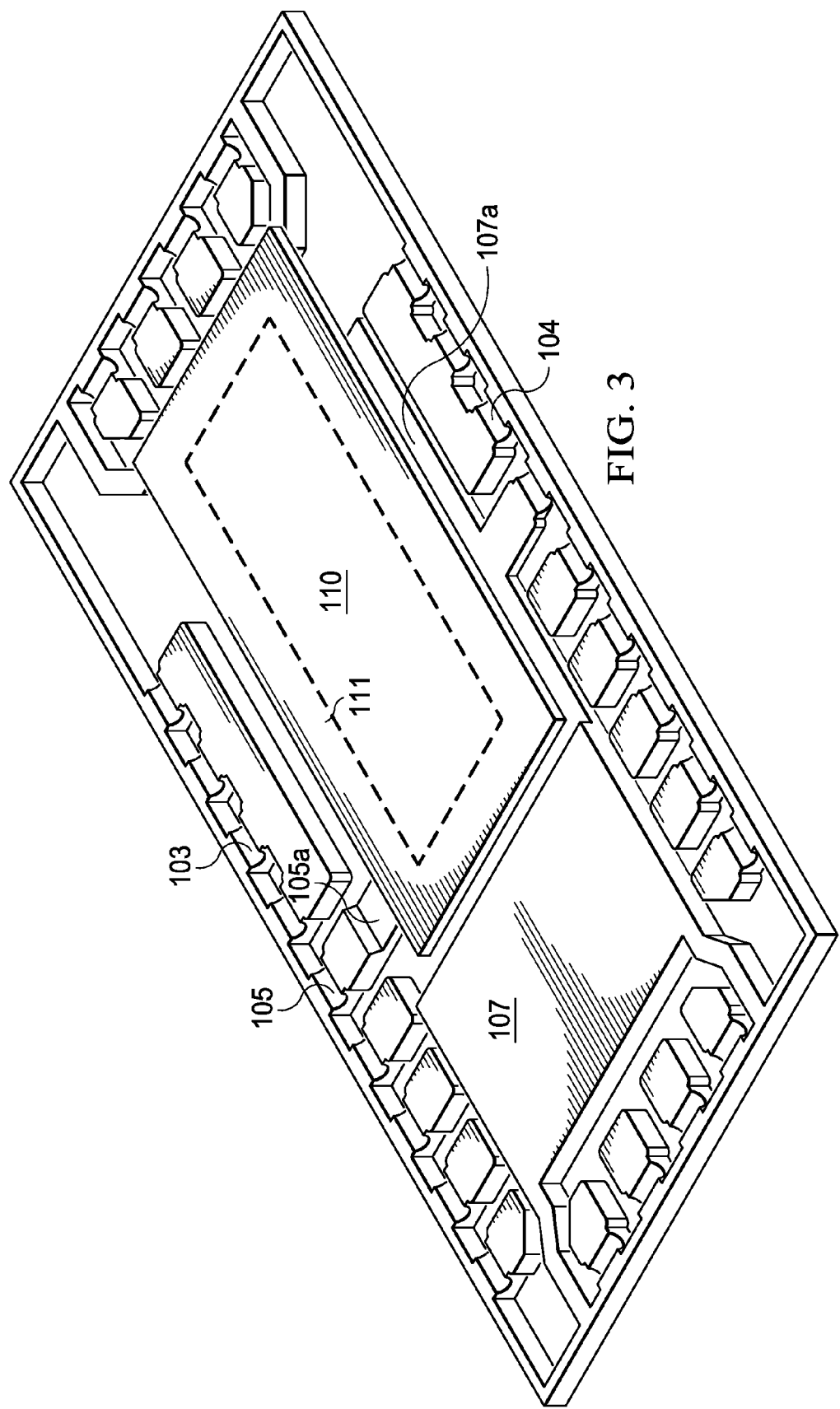
FIG. 3 depicts the leadframe of FIG. 2 with a semiconductor FET chip attached to the recessed portion of the leadframe pad, the chip being the first chip of the vertically stacked system, the un-attached chip terminal co-planar with the un-recessed portion of the leadframe pad.

FIG. 3 depicts leadframe 101 after the attachment of first FET chip 110 in the recessed pocket 107a of the leadframe pad. First FET chip 110 serves as the low side (LS) transistor of the system. It is a so-called vertical FET, since it has terminals on both chip surfaces. The source terminal of LS FET is attached to the recessed pad portion (107a in FIG. 2), which is connected to the grounded output terminal $V_{OUT}$ of the system. Furthermore, the gate terminal of LS FET is attached to the recessed lead portion (105a in FIG. 2), which serves as the LS gate lead. The drain terminal of FET chip 110 is visible in FIG. 3, since it faces upward; the drain terminal may be located within the approximate outline indicated by dashed lines 111. The attachment of chip 110 is performed so that the drain terminal becomes co-planar with the second surface 101b of the un-recessed pad portion 107.

FIGS. 4, 5 and 6 refer to the interposer 120. FIG. 4 illustrates the planar interposer surface 120a facing first chip 110 and the leadframe pad; surface 120a is herein referred to as third surface. FIG. 5 shows the opposite planar interposer surface 120b facing away from the leadframe; surface 120b is herein referred to as fourth surface. Between surface 120a and 120b, interposer 120 has a uniform height 120c so that interposer 120 has sheet-like features. In the example of FIGS. 4, 5, and 6, height 120c may be between 0.2 mm and 0.4 mm, preferably about 0.3 mm. As FIGS. 4 and 5 indicate, the sheet of interposer 120 is patterned in metallic traces 121, separated by gaps 122. The gaps are filled with electrically insulating material; preferably, the insulating material is an epoxy-based compound applied in a transfer molding process. Traces without thinned portions have low electrical and thermal resistance and are thus especially suitable to carry large electrical currents and to dissipate thermal energy.

In sum, the interposer displayed in FIGS. 4 and 5 is a flat, sheet-like interconnector for semiconductor devices attached to the interposer surfaces; the interposer has a network of metallic traces interdigitated with insulating zones. Due to different metallic-to-insulator height ratios, the interposer surfaces of FIG. 4 and FIG. 5 display different metallic contact areas. Since the interposer surface shown in FIG. 4 is to be attached to the leadframe with first chip 110 inserted into the pocket of the leadframe pad (as illustrated in FIG. 3), the interposer metal traces of FIG. 4 match the distribution of the pad, the leads, and the FET terminals; furthermore, a plurality of other traces serve the terminals of the driver-and-controller circuitry. Among the metal traces are trace 421a, which is to be tied to the input terminal $V_{IN}$ of the system, trace 421b, which is to be tied to the switch node terminal $V_{SW}$ of the system, and trace 421c, which is to be connected to ground potential. A plurality of other traces serves the terminals of the driver-and-controller circuitry. Other traces (herein referred to as third traces such as trace 421d in FIG. 4) serve as attachment contacts for the gates of the first and the second FET.

Since the interposer surface illustrated in FIG. 5 will be attached to the terminals of chip 130, which include the terminals of the second FET and the terminals of the integrated driver-and-controller circuitry, the interposer metal contacts of FIG. 5 match the distribution of these terminals. Among the metal traces are first trace 121a, which is to be tied to the input terminal $V_{IN}$ of the system, second trace 121b, which is to be tied to the switch node terminal $V_{SW}$ of the system, and trace 121c, which is to be connected to ground potential; further third trace 421d, which is tied to a transistor gate. A plurality of other traces serves the terminals of the driver-and-controller circuitry; they are referred to herein as fourth traces, such as the plurality of traces designated 421e in FIG. 4.

As the vertical cross section of an interposer portion in FIG. 6 explains, viewing the third surface of the interposer from the bottom in the direction of arrow 651 reveals much larger areas filled with insulating material compared to viewing the fourth surface of the interposer from the top in the direction of arrow 650. Portions of certain metallic traces have been partially thinned, or half-etched, in order to create trace portions of height 602, which are reduced relative to height 601. The thinned portions of the trace are then filled with insulating material 615, preferably a polymeric molding compound. Consequently, the bottom view 651 of the interposer reveals larger insulating areas and reduced metallic areas compared to top view 650.

Figure 7:
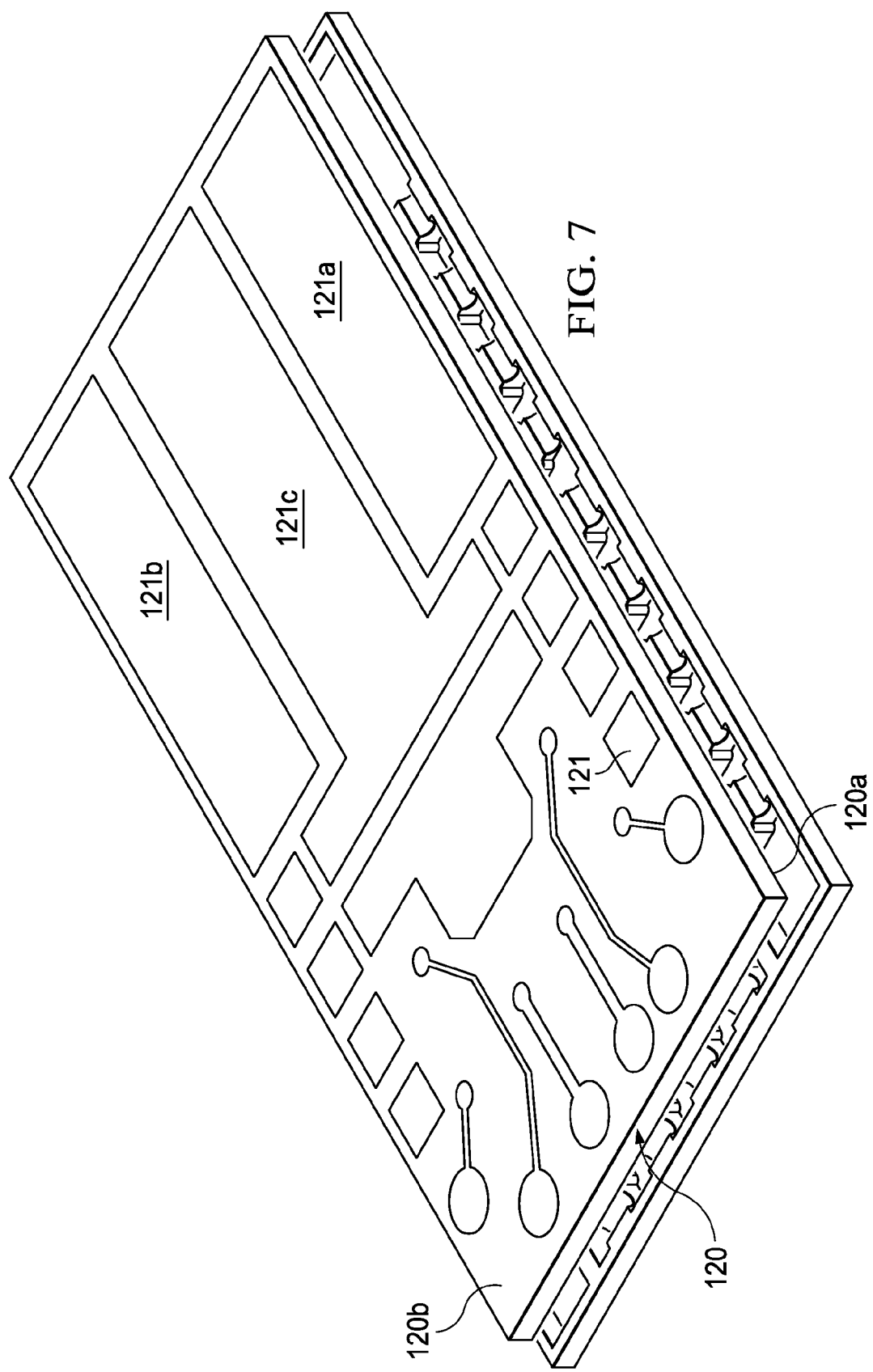
FIG. 7 depicts a perspective view of the vertical stack with the interposer attached to the leadframe and the first chip.

FIG. 7 shows interposer 120 with its third surface 120a attached to the leadframe leads, the pad, and the first chip embedded in the pad recess. Fourth surface 120b is facing away from the leadframe and shows as exemplary contacts trace 121a to be tied to $V_{IN}$, trace 121b to be tied to $V_{SW}$, and trace 121c to be grounded.

Figure 8:
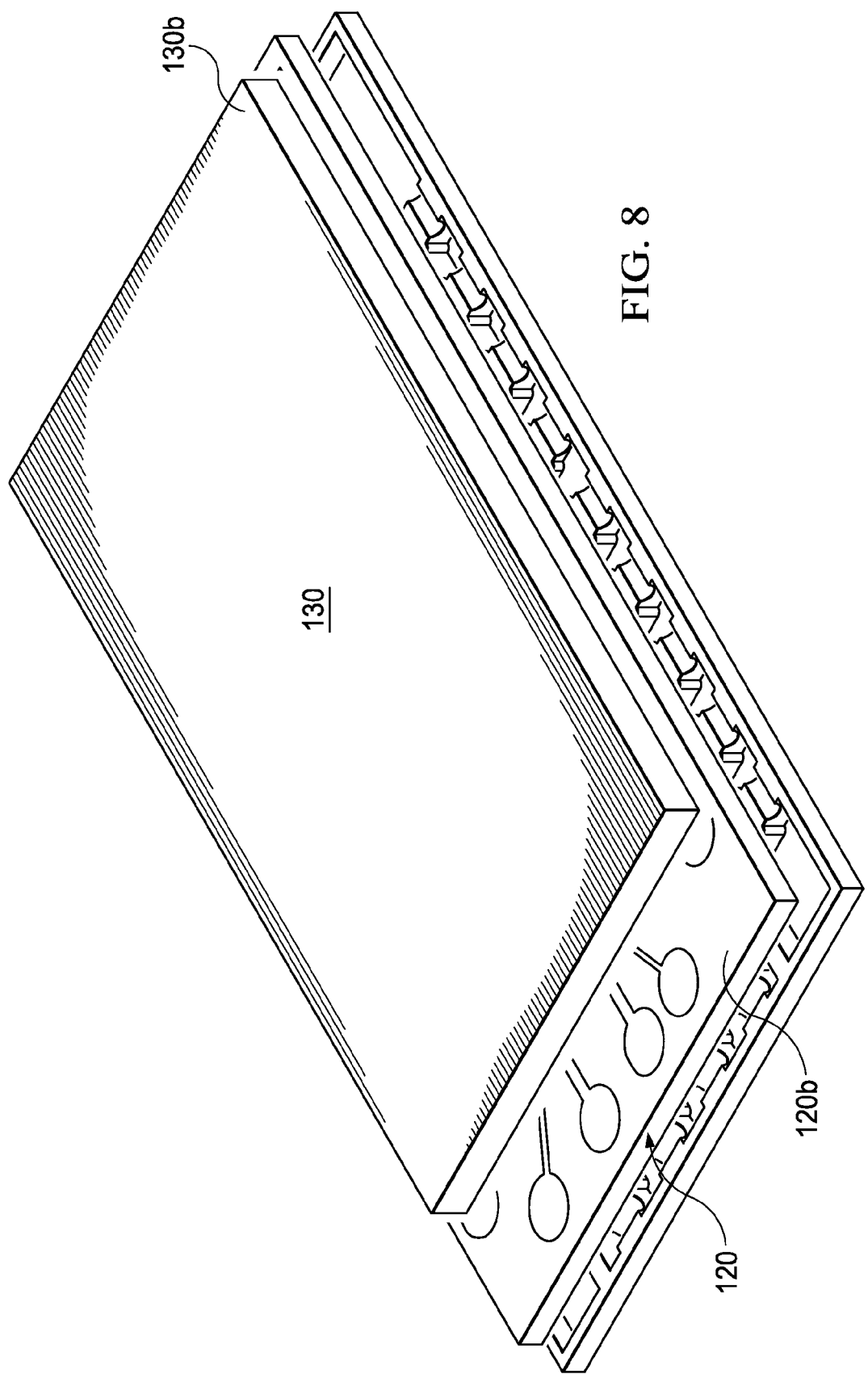
FIG. 8 illustrates a perspective view of the vertical stack with the second FET chip flip-attached to the interposer.

FIG. 8 shows second chip 130 flip-attached to the metal traces on fourth surface 120b of interposer 120. Chip 130 combines in one semiconductor chip an FET with all three terminals on one chip side and an integrated circuit serving as the driver and controller for the power converter system with the terminals on the same chip side. Since all terminals are on the chip side which is attached to the interposer, the opposite chip side 130b, facing away from interposer 120, remains free of terminals and is available for transferring thermal energy away out of the system, especially when a heat sink may be attached to the free chip side 130b.

In the example of FIGS. 7 and 8, the drain terminal of the second FET 130 is attached to trace 121*a* of the interposer, which is to be tied to the input terminals of the system. The source terminal of the second FET 130 is attached to trace 121*b* of the interposer, which is to be tied to the switch node terminal of the system. Further, trace 121*b* is attached to the drain terminal of the first FET 110.

As FIG. 8 indicates, there are no metal clips or metallic bonding wires involved in the assembly of the power supply system, in contrast to existing power supply systems. Conventionally, clips are made of thick metal, and bonding wires require space for forming the required loop heights. The elimination of these elements (without eliminating their function) translates into substantial savings of system height. Consequently, after encapsulating the power supply system of FIG. 8 into a packaging material such as a polymeric compound used in transfer molding processes, the encapsulated converter may have a height of less than 1 mm; it was mentioned in conjunction with FIG. 1, that packaged converters with heights between about 0.6 and 0.8 mm can be manufactured. In the encapsulation process, the first surface 101*a* of the leadframe (see FIG. 2), pad and leads, is left un-encapsulated; further, for some embodiments, the surface 130*b* of the second FET may be left un-encapsulated for enhancing the thermal characteristics of the system.

Another embodiment of the invention is a method for fabricating a power supply system such as a DC/DC converter. The method starts by providing a leadframe with leads and a pad with a first and a second surface; the second surface has a portion recessed for a pocket with a depth and an outline suitable for attaching a semiconductor chip; suitable techniques for creating the recess include chemical etching, mechanical coining, planishing, and ion milling. Next, a first semiconductor chip is provided, which has an FET with source and gate terminals on one chip side and the FET drain terminal on the opposite ship side. Then, the source terminal of the first FET chip is attached onto the recessed second surface of the leadframe pad.

In the next process step, a flat interposer is provided, which has a third and a fourth surface with a network of metallic traces alternating with insulating zones. The interposer is placed with its third surface on the second surface of the leadframe by connecting respective traces to the pad and leads and the drain terminal of the first FET.

Next, a second chip having on the same side the source, drain, and gate terminals of the second FET and the terminals of the integrated driver-and-controller circuitry. The second chip is place on the fourth surface of the interposer by connecting source, drain, and gate terminals of the second FET and the terminals or the driver-and-controller circuitry to respective interposer traces. A vertical stack of chips and interposer is thus created without the help of metallic clips and bonding wires. The vertical stack may be encapsulated in a packaging compound, which may leave un-encapsulated at least the first surface of the leadframe and in some systems also the surface of the second chip opposite the FET terminals. Finally, any connecting leadframe rails protruding from the package may be removed in a trimming process.

The fabrication of the interposer starts with providing a flat sheet of metal which has a first height, a first surface in a first plane and a second surface in a parallel second plane. The sheet of metal is patterned (for instance by an etching technique) into a plurality of traces separated by gaps. Portions of certain traces are then thinned to a second height smaller than the first height; suitable thinning techniques include etching, planishing, and ion milling. Finally, the gaps and the thinned trace portions are filled with an insulating material such as a polymeric molding compound, which is confined by the first and the second plane. As a result, the flat interposer has a third and a fourth surface with networks of metallic traces alternating with insulating zones, which may be different at the third and the fourth surface.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to field effect transistors, but also to other suitable power transistors.

As another example, the high current capability of the power supply module can be further extended, and the efficiency further enhanced, by leaving the surface of the second chip opposite the FET terminals un-encapsulated so that this surface can be connected to a heat sink, preferably by soldering. In this configuration, the module is dual cooled by the leadframe and by the outward facing surface of the second FET and can thus dissipate its heat from both large surfaces to heat sinks.

It is therefore intended that the appended claims encompass any such modifications or embodiments.

I claim:

1. A method for fabricating a power supply system comprising the steps of:
    providing a leadframe having leads and a pad with a first and a second surface, the second surface having a portion recessed for a pocket with a depth and an outline suitable for attaching a semiconductor chip;
    providing a first chip with FET source and gate terminals on one side and FET drain terminal on the opposite side;
    attaching the source terminal of the first FET chip onto the recessed second surface of the pad;
    providing a flat interposer having a third and a fourth surface with a network of metallic traces alternating with insulating zones;
    placing the interposer with its third surface on the second surface of the leadframe by connecting respective traces to the pad and leads, and the drain terminal of the first FET;
    providing a second chip having on the same side the source, drain, and gate terminals of the second FET and the terminals of the integrated driver-and-controller circuitry; and
    placing the second chip on the fourth surface of the interposer by connecting source, drain, and gate terminals of the second FET and the terminals or the driver-and-controller circuitry to respective traces, completing the vertically stacked power supply system.

2. The method of claim 1 further including, before the step of providing an interposer, the steps of:
    providing a flat sheet of metal having a first height, a first surface in a first plane and a second surface in a parallel second plane;
    patterning the sheet metal into a plurality of traces separated by gaps;
    thinning portions of certain traces to a second height smaller than the first height; and
    filling the gaps and the thinned trace portions with an insulating material confined by the first and the second plane, thereby creating a flat interposer having a third and a fourth surface with networks of metallic traces alternating with insulating zones.

3. The method of claim 1 further including, after the step of placing the second chip, the step of encapsulating the vertically stacked system in a packaging compound, leaving the first surface of the leadframe un-encapsulated.

4. The method of claim 1 further including, after the step of placing the second chip, the step of encapsulating the vertically stacked system in a packaging compound, leaving the first surface of the leadframe and the surface of the second chip opposite the FET terminals un-encapsulated.

\* \* \* \* \*